United States Patent [19]

Christopher et al.

[11] 4,377,788
[45] Mar. 22, 1983

[54] SIGNAL EXPANDER

[75] Inventors: Todd J. Christopher, Indianapolis; Gopi N. Mehrotra, Carmel, both of Ind.

[73] Assignee: RCA Corporation, New York, N.Y.

[21] Appl. No.: 229,743

[22] Filed: Jan. 29, 1981

[51] Int. Cl.³ ............................................. H03G 3/30
[52] U.S. Cl. .................................... 330/136; 330/278; 333/14
[58] Field of Search ................... 333/14; 330/129, 136, 330/278, 285; 455/72

[56] References Cited

U.S. PATENT DOCUMENTS

| | | | |
|---|---|---|---|
| 3,732,371 | 5/1973 | Burwen | 179/1 R |
| 3,980,964 | 9/1976 | Grodinsky | 330/29 |
| 4,024,463 | 5/1977 | Pelley | 330/138 |
| 4,220,929 | 9/1980 | Talbot et al. | 330/136 |
| 4,307,348 | 12/1981 | Nicholson | 330/134 |

OTHER PUBLICATIONS

Pickering, "High Fidelity Volume Expander", Audio Engineering, Sep. 1947, pp. 112-124.

Primary Examiner—James B. Mullins
Assistant Examiner—Gene Wan
Attorney, Agent, or Firm—E. M. Whitacre; J. S. Tripoli; R. G. Coalter

[57] ABSTRACT

The envelope of an input signal to be expanded is detected and applied via an adaptive filter to the gain control input of a variable gain device which expands the input signal. The adaptive filter provides improved ripple reduction and transient response characteristics and comprises a low pass filter for producing a smoothed control signal and an analog gate for coupling the greater of the smoothed control signal or a further signal to the variable gain device, the further signal being equal to the filter input signal less two predetermined constants. The gate further includes plural current paths selectively enabled for different conditions of the low pass filter input and output signals for augmenting the supply of current to the filter.

6 Claims, 1 Drawing Figure

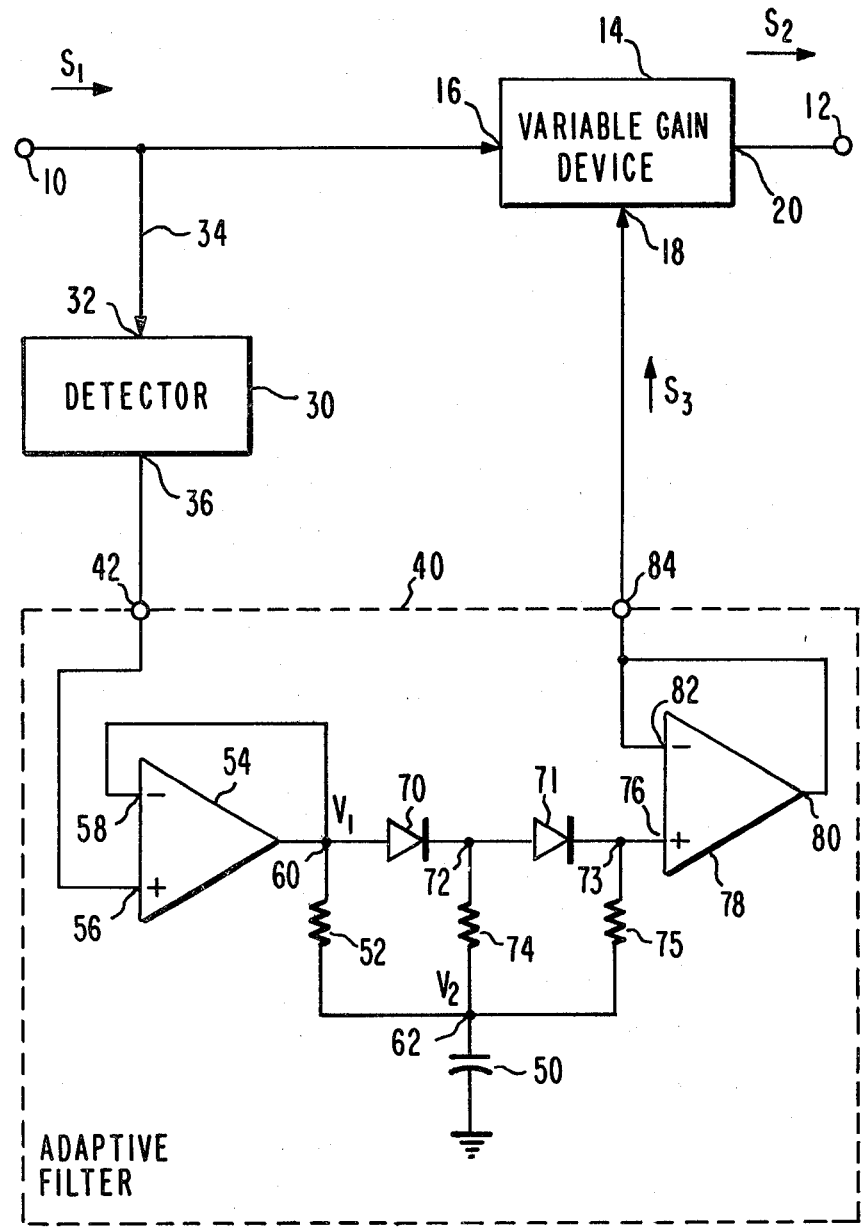

SIGNAL EXPANDER

This invention relates to signal expanders and particularly to expanders for restoring the dynamic range of compressed signals or increasing the effective dynamic range of uncompressed signals.

It is known that one may preserve the dynamic range of an electrical signal transmitted through a path or medium of relatively limited dynamic range by compressing the signal prior to transmission and then expanding the signal subsequent to transmission. Examples of audio noise reduction systems employng such a "companding" (i.e., compression-expansion) technique are U.S. Pat. No. 3,732,371 which issued May 8, 1973, to R. S. Burwen and U.S. Pat. No. 4,220,429 which issued to Talbot et al., Sept. 2, 1980.

It is also known that one may improve the apparent dynamic range of electrical signals by means of an expander even though the signals may be of uncompressed form. Examples of audio expanders for such "playback only" applications are given, for example, in the article "High-Fidelity Volume Expander" by N. C. Pickering in the September 1947 issue of AUDIO ENGINEERING magazine and U.S. Pat. No. 3,980,964 which issued Sept. 14, 1976 to R. M. Grodinsky.

A problem common to expanders (for either compressed or uncompressed signals) concerns avoidance of undesirable psychoacoustical effects commonly referred to as "pumping" or "breathing". This problem is particularly troublesome when the amplitude of the signal to be expanded suddenly changes, such as that occurring in a signal representative of a musical crescendo which produces a sudden surge in volume. In order to fully expand a crescendo or transient signal, it is customary to employ control circuits in the expander which quickly respond to transient signals but which respond more slowly for dynamically slowly changing signals. For this reason, expanders generally employ some form of adaptive or non-linear filtering to vary the expansion characteristic under differing dynamic conditions of the signal to be expanded.

As an example, in the arrangement proposed by Talbot et al., the input signal to be expanded is applied to a detector which produces a control voltage which varies as a function of the input signal envelope. The control voltage is applied via the parallel combination of a diode and a first resistor to the control terminal of a gain control amplifier in the main signal path. The control terminal is also coupled to ground via a series connection of a second resistor and a capacitor.

Such an arrangement has a number of desirable features. For example, for large input signal transients the diode becomes forward biased so that the control voltage is coupled essentially instantaneously to the amplifier control terminal thereby enabling immediate expansion of the input signal by the amplifier. The capacitor, which normally smooths the control voltage, is prevented from becoming excessively charged for brief transients because of the presence of the second resistor. As a result, the gain of the amplifier quickly returns to its previous value subsequent to a brief transient signal condition. A further feature is that the capacitor and two resistors form a program level dependent release circuit. When the transient goes away and the detector output voltage drops, the diode becomes reverse biased and the capacitor discharges through the resistors to the current value of the program level.

In the copendng U.S. patent application Ser. No. 229,518 (now abandoned) of C. B. Dieterich entitled "SIGNAL EXPANDER WITH ADAPTIVE CONTROL CIRCUIT" it is recognized that there are three areas for improvement in expanders employing adaptive filters of the type described above. Those areas are: (1) control signal ripple reduction; (2) program level dependent release time; and (3) transient effects induced by rapid program level reduction. Improvement in those areas is provided in the expander proposed by Dieterich by detecting the envelope of an input signal to be expanded and applying the output of the envelope detector as a gain control signal to a variable gain device which expands the input signal. The control signal is applied via an adaptive filter which includes a low pass filter for producing a smoothed control signal that is essentially ripple free and an analog gate. The gate couples the greater of the smoothed signal or a further signal to the variable gain device, the further signal being equal to the detector output signal less a constant.

Notwithstanding the advantages of the Dieterich expander, it has been found that further improvement may be realized in at least two areas, namely; (1) further reduction of control signal ripple; and (2) minimization of certain parasitic coupling effects. The present invention is directed to meeting the need for these further improvements.

A signal expander, in accordance with the invention, includes input means for receiving an input signal to be expanded, detector means responsive to the input signal for producing a first control signal having an amplitude which varies as a function of the envelope of the input signal and a variable gain means. The variable gain means has a first input coupled to receive the input signal, a second input for receiving an expansion control signal and an output for providing an expanded output signal. An adaptive filter means, responsive to the first control signal, produces and supplies the expansion control signal to the second input of the variable gain means. The adaptive filter means comprises a low pass filter means including a capacitor and a current source means, the current source means being responsive to the control signal produced by the detector means for supplying charging current to the capacitor proportional to a potential difference, $V_1 - V_2$, wherein $V_1$ is a voltage proportional to the control signal and $V_2$ is a voltage stored in the capacitor as a result of the charging thereof and independent of the instantaneous value of the charging current. The adaptive filter further includes analog gating means for coupling the greater of the second voltage, $V_2$, or a third voltage, $V_3$, to the second input of the gain control means, the voltage $V_3$ being equal to a potential difference $V_1 - K_1 - K_2$ wherein $K_1$ and $K_2$ are each constants. The analog gating means also includes a first current path for augmenting the current supplied to the capacitor when the voltage $V_1$ exceeds $V_2 + K_1$ and a second current path for augmenting the current supplied to the capacitor when the voltage $V_1$ exceeds $V_2 + K_1 + K_2$.

The invention is illustrated in the accompanying drawing in which the sole FIGURE is a block diagram, partially in schematic form, of a single band, single channel, syllabic expander embodying the invention. It will readily be appreciated, as discussed subsequently, that the principles of the invention may be applied to multiband expanders and to multichannel (e.g., stereophonic or quadraphonic) expanders as well. Illustratively, it will be assumed that the signal to be expanded is an audio signal although signals in other frequency bands (e.g., infrasonic, supersonic, video, RF, etc.) may also be expanded by an appropriate selection of the expander design parameters (e.g., resistor values, capacitor values, diode types, detector and amplifier types, etc.) to conform to the desired input signal frequency band.

The expander comprises an input terminal 10 for receiving an input signal $S_1$ to be expanded and an output terminal 12 for providing an expanded output signal $S_2$. Input terminal 10 is coupled to output terminal 12 via a variable gain device 14 having a first input 16 coupled to terminal 10 for receiving the signal $S_1$ to be expanded, a second input terminal 18 for receiving an expansion control signal $S_3$ and an output terminal 20 coupled to supply the expanded output signal $S_2$ to output terminal 12.

Variable gain device 14 may be of either the attenuating or the amplifying type, both being well known, and provides the function of controlling the level of the signal to be expanded in accordance with the value of the expansion control signal. Illustratively, an attenuating type of variable gain device may be constructed by coupling a resistor between terminals 16 and 20, coupling terminal 20 to a suitable source of reference potential (e.g., ground) via the conduction path of a field effect transistor and applying the control signal $S_3$ to the transistor gate electrode. Such a relatively simple variable gain device may exhibit a relatively limited gain or level control range. In expander applications where a relatively wide signal expansion range is desired it is preferable that device 14 be of the controllable gain amplifier type such as, illustratively, an operational transconductance amplifier, or a precision analog signal multiplier. Such devices are well known. See generally the article "Linear ICs" by D. Ranada published in the Aug. 20, 1979 edition of the magazine EDN which provides a technical discussion of variable gain amplifiers.

The expansion control signal $S_3$ is produced, initially, by a detector 30 and coupled to the control terminal 18 of variable gain device 14 via an adaptive filter 40. Detector 30 has an input terminal 32 coupled to terminal 10 via a conductor 34 and an output terminal 36 coupled to the input terminal 42 of filter 40. Detector 30 provides the function of rectifying the input signal $S_1$ to produce an output signal at terminal 36 which varies as a function of the envelope of amplitude of the input signal $S_1$. For purposes of the present invention, the detector 30 may be of the average, peak or RMS responding type, all of which are well known.

Where the signal to be expanded is an audio frequency signal, it is desirable that detector 30 include a high pass filter in its input stage to reject low frequency noise components. A suitable cut off frequency would be on the order to 500 Hz or perhaps somewhat higher. In multiband expanders (i.e., expanders in which the signal is divided into several of individual frequency bands), it is desirable that each detector include an input filter having a bandwidth corresponding to, or perhaps slightly less, than the frequency band of the variable gain device that it controls.

Adaptive filter 40 couples the signal produced by detector 30 to the second input terminal 18 of variable gain device 14 and modifies the dynamic characteristics of the detector ouput signal in several ways, so as to reduce the signal ripple content, reduce the transient signal recovery time and eliminate completely step changes in the signal induced by relatively small but rapid reductions in the input signal level. The filter further is relatively free of certain parasitic capacitive coupling effects as will be discussed in detail subsequently.

Filter 40 includes two principle elements, namely, a low pass filter and an analog signal gating circuit. The low pass filter includes a capacitor 50 and a current source comprising a resistor 52 and a voltage follower amplifier 54. Amplifier 54 has a non-inverting input terminal 56 connected to adaptive filter input terminal 42 and an inverting input terminal 58 connected to a circuit node 60 and to the amplifier output terminal. As is known, a differential amplifier connected in such a manner exhibits essentially unity gain without inversion, a relatively high input impedance (thereby presenting substantially no load to the output of detector 30) and a very low output impedance (because of the essentially 100% negative feedback). Accordingly, the voltage V1 at node 60 is substantially equal to the output voltage produced by detector 30 and independent of any loading effects of elements connected to node 60.

For audio signal expansion purposes, a relatively inexpensive operational amplifier suitable for use as amplifier 54 is the type 741 integrated internally compensated operational amplifier. Integrated circuits containing as many as four such amplifiers on one semiconductor die are also available and are preferred as the additional amplifiers may be used in the detector as precision rectifiers as well as in the filter (which uses two amplifiers). Advantages of using such "quad" operational amplifier integrated circuits include reduced cost, improved reliability (because of fewer interconnections needed) and minimization of circuit board space.

The remainder of the low pass filter portion of adaptive filter 40 comprises a node 62 which is coupled to node 60 via resistor 52 and to one plate of capacitor 50, the other plate of capacitor 50 being coupled to a source of reference potential (in this case, ground). Illustratively, for purposes of audio signal expansion, resistor 52 may have a value on the order of 200,000 Ohms and capacitor 50 may have a value on the order of about 10 microfarads thereby resulting in a relatively long time constant of 2 seconds.

The analog signal gating portion of adaptive filter 40 comprises a diode 70 having an anode connected to node 60 and a cathode connected to a further node 72 which, in turn, is coupled to node 62 via a resistor 74 and to the anode of a further diode 71. The cathode of diode 71 is connected to a node 73 which is coupled to node 62 via a resistor 75 and to the non-inverting input terminal 76 of another operational amplifier 78.

Amplifier 78, like amplifier 54, is also connected as a voltage follower. In this case, however, the voltage follower connection of amplifier 78 is for the purpose of minimizing loading of node 73. Specifically, the input impedance at terminal 76 is much greater than the values of resistor 74 or 75 so that the time constant formed by resistor 74 and capacitor 50 is substantially unaffected by amplifier 78. A high input impedance for amplifier 78 is also desirable to prevent excessive current flow through diodes 70 and 71 since the anode of diode 70 is connected to a low impedance node 60 and, when forward biased, the diodes form a low impedance path. For the assumed value of 10 microfarads for capacitor 50, a suitable value for resistor 74 would be on the order of 3,000 ohms, therefore providing a time constant of 30 milliseconds. This allows capacitor 50 to be charged relatively quickly when diode 70 is conductive but prevents excessive charging of capacitor 50 for brief high amplitude transients. A suitable value for resistor 75 would be one intermediate the values of resistors 52 and 74, illustratively, on the order of 22,000 ohms. Resistor 75 provides the dual functions of augmenting the supply of charging current to capacitor 50 when diode 71 is conductive and serving as a direct current conductive path for applying the voltage $V_2$ to node 73 when diode 71 is non-conductive.

The output terminal 80 of amplifier 78 is connected to its inverting input terminal 82 (which causes voltage follower operation of the amplifier as previously mentioned) and to output terminal 84 of adaptive filter 40. Terminal 84 is coupled to the gain control input terminal 18 of device 14 for supplying the expansion or gain control signal $S_3$ thereto.

Before considering the overall expander operation it is helpful first to consider some of the steady-state or static characteristics of adaptive filter 40. The current source formed by amplifier 54 and resistor 52 supplies charging current to capacitor 50 proportional to the potential difference $V_1 - V_2$ between nodes 60 and 62. The voltage $V_1$ is proportional to the output voltage of detector 30 and is not influenced by the conductive states of diodes 70 or 71. This follows because the output impedance of amplifier 54 is very low as compared with the values of resistors 52, 74 and 75 and the input impedance of amplifier 78 is very high. The node 62 voltage $V_2$ equals the voltage stored on capacitor 50 as a result of the charging current supplied thereto and is independent of the instantaneous value of the charging current. This latter factor results because, the voltage on a capacitor cannot be changed instantaneously and there are no intervening elements in the connection of capacitor 50 between node 62 and ground.

The analog gating portion of filter 40 (i.e., elements 70, 71, 74, 75 and 78) provides a number of desirable functions. A principal function is to couple the greater of the capacitor voltage $V_2$ or a third voltage $V_3$ to output terminal 84. The third voltage, $V_3$, is equal to a potential difference $V_1 - K_1 - K_2$ wherein $K_1$ is a constant determined by the threshold or "turn-on" voltage of diode 70 and $K_2$ is a constant determined by the threshold voltage of diode 71. The "dead band" thus provided by diodes 70 and 71 (i.e., the sum of their threshold voltages) is advantageous in that under steady state condition when the capacitor voltage $V_2$ substantially equals $V_1$, any ripple component of $V_1$ less than $K_1 + K_2$ will not be passed by diodes 70 and 71 but instead will be smoothed by capacitor 50. A further advantage of the series connection of the diodes is substantial reduction in parasitic capacitive coupling between nodes 60 and 73. If, for example, each diode exhibited 10 picofarads of parasitic capacitance, then the net capacitance between nodes 60 and 73 would be reduced by a factor of two to 5 picofarads. This also tends to reduce the ripple or noise content of the filter 40 output signal.

Still considering the analog gating circuit, the voltage $V_2$ is coupled to node 73 with substantially no loss when diode 71 is nonconductive. This results because the input impedance of amplifier 78 is very high so that substantially no current flows through resistor 75 and essentially no voltage drop appears across it. However, when diode 71 is conductive, resistor 75 supplies additional charging current to capacitor 50 to augment that supplied by resistors 52 and 74. A final point regarding the analog gating circuit, per se, is that for changes in $V_1$ such that diode 70 is conductive and diode 71 non-conductive, resistor 74 will augment the current supplied to capacitor 50 and ripple components of the output signal will be reduced by the combined effects of integration in capacitor 50 and decoupling provided by non-conductive diode 71.

Overall operation of the expander and the interactive relationships of device 14, detector 30 and filter 40 is relatively complex but may be easily understood by considering a few specific examples of different dynamic conditions of the input signal $S_1$. First, assume that $S_1$ is a steady state signal or one having an amplitude which changes relatively slowly relative to the two second time constant of resistor 52 and capacitor 50. In this case the voltage $V_2$ of capacitor 50 will very nearly equal $V_1$ and diodes 70 and 71 will therefore be turned off. Any ripple voltage component which may be present in the output signal of detector 30 will thus be greatly attenuated by resistor 52 and capacitor 50 and so envelope ripple components will have substantially no effect on variable gain device 14. This results because even though the instantaneous charging current for capacitor 50 may include a ripple component, the voltage across capacitor 50 cannot change instantaneously and it is this voltage which is coupled to device 14 via the analog gate. Additional ripple and noise reduction is provided by the combined effects of the additive nature of the diode threshold voltages and the subtractive nature of their parasitic capacitances.

As a second example of the dynamic operation of the expander, assume that the signal to be expanded includes a very brief transient increase in signal level, shorter than the time constant formed by resistor 74 and capacitor 50 and greater than $K_1 + K_2$. In this case the transient component of the control signal will be coupled directly through diodes 70 and 71 to device 14 essentially bypassing the low pass filter. As a result device 14 will expand the signal $S_1$ essentially instantaneously and will immediately return to its previous gain level when the transient passes. Resistors 74 and 75, in this case, prevent capacitor 50 from receiving any significant charge for such brief positive transients. For longer transients, such as a moderately fast crescendo, resistor 74 does conduct sufficient current to capacitor 50 to enable the capacitor voltage to follow the longer transient so that as the crescendo ends the gain of device 14 does not abruptly decrease to its earlier value but decreases rather slowly because of discharge of capacitor 54 through resistor 52. Resistors 74 and 75 do not provide a discharge path for capacitor 50 under decrescendo conditions because diodes 70 and 71 are both reverse biased for $V_1 < V_2$ and the bias current at terminal 76 of amplifier 78 is negligible.

Various changes may be made to the expander of the present invention. For a multi-channel system, (for example, stereophonic or quadrophonic), each channel may be provided with a separate detector and variable gain device. Only a single adaptive filter would be needed, however, by appropriately combining the detector outputs and applying the filter output to the control terminal of each variable gain device. The amplifiers 54 and 78 may be replaced by other suitable impedance transforming devices (e.g., emitter followers) and may be readily adapted to provide voltage gain (or reduction) if desired in a specific application. Amplifier 54 may be eliminated entirely if the output impedance of detector 36 is relatively low as compared, for example, with the values of resistors 52, 74 and 75. Amplifier 78 also may be eliminated if the input impedance of variable gain device 14 is relatively high so that it presents no significant loading effect at node 73. The reference potential to which the lower plate of capacitor 50 is connected is a matter of design choice but, if other than ground, should be a substantially fixed voltage level so as not to introduce control signal variations unrelated to the signal being expanded. The diode poling may be reversed for detectors which produce negative rather than positive control voltages. An appropriate change (e.g., signal inversion) should be made for controlling device 14 in such a case.

What is claimed is:

1. A signal expander, comprising, in combination:
   input means for receiving an input signal to be expanded;
   detector means responsive to said input signal for producing a first control signal having an amplitude which varies as a function of the envelope of said input signal;
   variable gain means having a first input terminal coupled to receive said input signal, a second input terminal for receiving an expansion control signal and an output terminal for providing an expanded output signal; and
   adaptive filter means responsive to said first control signal for producing said expansion control signal and supplying said expansion control signal to said second input terminal of said variable gain means, said adaptive filter means comprising:
   low pass filter means including a capacitor and a current source means, said curent source means being responsive to said first control signal produced by said detector means for supplying charging current to said capacitor proportional to a potential difference, $V_1 - V_2$, wherein $V_1$ is a voltage proportional to said first control signal and $V_2$ is a voltage stored in said capacitor as a result of the charging thereof and independent of the instantaneous value of said charging current; and
   analog gating means for coupling the greater of said second voltage, $V_2$, or a third voltage, $V_3$, to said second input terminal of said gain control means, the voltage $V_3$ being equal to a potential difference $V_1 - K_1 - K_2$ wherein $K_1$ and $K_2$ are each non-zero constants, said analog gating means including a first current path for augmenting the current supplied to said capacitor when the voltage $V_1$ exceeds $V_2 + K_1$, said analog gating means also including a second current path for augmenting the current supplied to said capacitor when the voltage $V_1$ exceeds $V_2 + K_1 + K_2$.

2. The combination as recited in claim 1 wherein said low pass filter means comprises:
   an input node;
   means for applying said voltage $V_1$ to said input node;
   an output node;
   a first resistor connected between said input and output nodes;
   a source of substantially fixed reference potential; and
   means for connecting said capacitor without intervening elements between said output node and said source of substantially fixed reference potential.

3. The combination as recited in claim 2 wherein said analog gating means comprises:
   first and second circuit nodes;
   first threshold conduction means connected between said input node of said low pass filter means and said first circuit node and having a threshold voltage equal to said constant $K_1$;
   second threshold conduction means connected between said first and second circuit nodes and having a threshold voltage equal to said constant $K_2$;
   A second resistor connected between said output node of said low pass filter means and said first circuit node; said second resistor having a value substantially less than that of said first resistor in said low pass filter means;
   a third resistor connected between said second circuit node and said output node of said low pass filter means; and
   means for coupling said second circuit node to said second input terminal of said variable gain means.

4. The combination as recited in claim 3 wherein said third resistor has a value selected to be intermediate the values of said first and second resistors.

5. The combination as recited in claim 3 wherein said means for applying said voltage $V_1$ to said input node comprises amplifier means having an input terminal connected to an output terminal of said detector means for receiving said first control signal and an output terminal connected to said input node of said low pass filter means, said amplifier means being of a type having an output impedance substantially lower than the values of any of said first, second or third resistors.

6. The combination recited in claim 3 wherein said means for coupling said second node to said second input of said variable gain means comprises amplifier means having an input terminal connected to said second node and an output terminal connected to said second input terminal of said variable gain means, said amplifier means being of a type having an input impedance substantially greater than the value of said third resistor.

* * * * *